United States Patent
Shigihara et al.

(10) Patent No.: US 7,289,546 B1
(45) Date of Patent: Oct. 30, 2007

(54) SEMICONDUCTOR LASER HAVING AN IMPROVED STACKED STRUCTURE

(75) Inventors: Kimio Shigihara, Tokyo (JP); Yoshihiko Hanamaki, Tokyo (JP); Kimitaka Shibata, Tokyo (JP); Kazushige Kawasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/550,841

(22) Filed: Oct. 19, 2006

(30) Foreign Application Priority Data

Jan. 24, 2006 (JP) .............................. 2006-014625
Aug. 1, 2006 (JP) .............................. 2006-209746

(51) Int. Cl.
*H01S 5/00* (2006.01)
(52) U.S. Cl. ................................. 372/43.01; 372/45.01
(58) Field of Classification Search ............. 372/43.01, 372/45.01
See application file for complete search history.

(56) References Cited

FOREIGN PATENT DOCUMENTS

JP          2004-63537          2/2004

OTHER PUBLICATIONS

D. Botez, et al.; "66% CW wallplug efficiency from Al-free 0.98 µm-emitting diode lasers", *Electronics Letters*, vol. 32, No. 21, pp. 2012-2013, (Oct. 10, 1996).
K. S. Chan, et al.; "Optical Gain of Interdiffused InGaAs-GaAs and AlGaAs-GaAs Quantum Wells", *IEEE J. of Quantum Electronics*, vol. 34, No. 1, pp. 157-165, (Jan. 1998).
Kenichi Iga; "Semiconductor Laser", *Applied Physics Series* (Specialist Course), edited by the Japan Society of Applied Physics, Ohmsha, Ltd., pp. 41 (1994).
Z. C Feng, et al.; "Nondestructive assessment of $In_{0.48}(Ga_{1-x}Al_x)_{0.52}P$ films grown on GaAs (001) by low pressure metalorganic chemical vapor deposition", *J. of Applied Physics*, vol. 85, No. 7, pp. 3824-3831, (Apr. 1999).

*Primary Examiner*—Armando Rodriguez
(74) *Attorney, Agent, or Firm*—Leydig, Voit & Mayer, Ltd.

(57) ABSTRACT

An n-type first cladding layer, a first guide layer, a first enhancing layer, an active layer, a second enhancing layer, a second guide layer, and a p-type second cladding layer are sequentially stacked on an n-type GaAs substrate. The thickness of each of the first guide layer and the second guide layer is 100 nm or more. In such a semiconductor laser, the difference between the Eg (band gap energy) of the first guide layer and the Eg of the active layer (or the difference between the Eg of the second guide layer and the Eg of the active layer) is made 0.66 times or less of the difference between the Eg of the first cladding layer and the Eg of the active layer (or the difference between the Eg of the second cladding layer and the Eg of the active layer).

7 Claims, 10 Drawing Sheets

Position of vertical direction to substrate (μm)

SEMICONDUCTOR LASER HAVING AN IMPROVED STACKED STRUCTURE

BACKGROUND OF THE INVENTION

1. Field of the Invention

The present invention relates to a semiconductor laser in general, and specifically, to a solid laser such as Nd-doped or Yb-doped YAG laser, a Y-doped fiber laser, a semiconductor laser used as an exciting light source for an Er-doped fiber amplified and the like.

2. Background Art

A semiconductor laser is widely used as a light source for optical communication systems and the like. For example, a semiconductor laser having an emission wavelength of 940 nm is formed using an n-type GaAs substrate or the like.

A cross-sectional structure of the above-mentioned semiconductor laser will be described. In this structure, for example, an n-type clad layer, an n-side guide layer, an n-side enhancing layer, an active layer, a p-side enhancing layer, a p-side guide layer, a p-type clad layer, a p-type GaAs contact layer, and a p-electrode are sequentially stacked on an n-type substrate. Furthermore, an n-electrode is formed on the back face of the n-type GaAs substrate.

As a material for the above-described active layer, for example, $In_{0.07}Ga_{0.93}As$ is used. According to "Optical Gain of Interdiffused InGaAs-GaAs and AlGaAs-GaAs Quantum Wells, IEEE J. Quantum. Electoron., Vol. 34, No., 1, pp. 157-165, Jan. 1998, K. S. Chan, E. H. Li, and M. C. Y. Chan", the band gap energy of $In_{0.07}Ga_{0.93}As$ is 1.319 eV. Hereafter, the above-mentioned document will be described as "K. S. Chan et al.".

As a material for the above-described n-side guide layer and p-side guide layer, for example, $In_{0.49}Ga_{0.51}P$ is used. According to "Semiconductor Laser, p. 41, K. Iga," the band gap energy of $In_{0.49}Ga_{0.51}P$ is 1.848 eV. Hereafter, the above-mentioned document will be described as "K. Iga".

As a material for the above-described n-type clad layer and p-type clad layer, for example, $(Al_{0.3}Ga_{0.7})_{0.5}In_{0.5}P$ is used. According to "Nondestructive assessment of $In_{0.48}(Ga_{1-x}Alx)_{0.52}P$ films grown on GaAs (001) by low pressure metalorganic chemical vapor deposition, J. Appl. Phys., Vol. 85, No. 7, pp. 3824-3831, Apr. 1999, Z. C. Feng, E. Armour, I. Ferguson, R. A. Stall, T. Holden, L. Malikova, J. Z. Wan, and F. H. Pollak," the band gap energy of $(Al_{0.3}Ga_{0.7})_{0.5}In_{0.5}P$ is 1.971 eV. Hereafter, the above-mentioned document will be described as "Z. C. Feng et al.".

Figure 9:
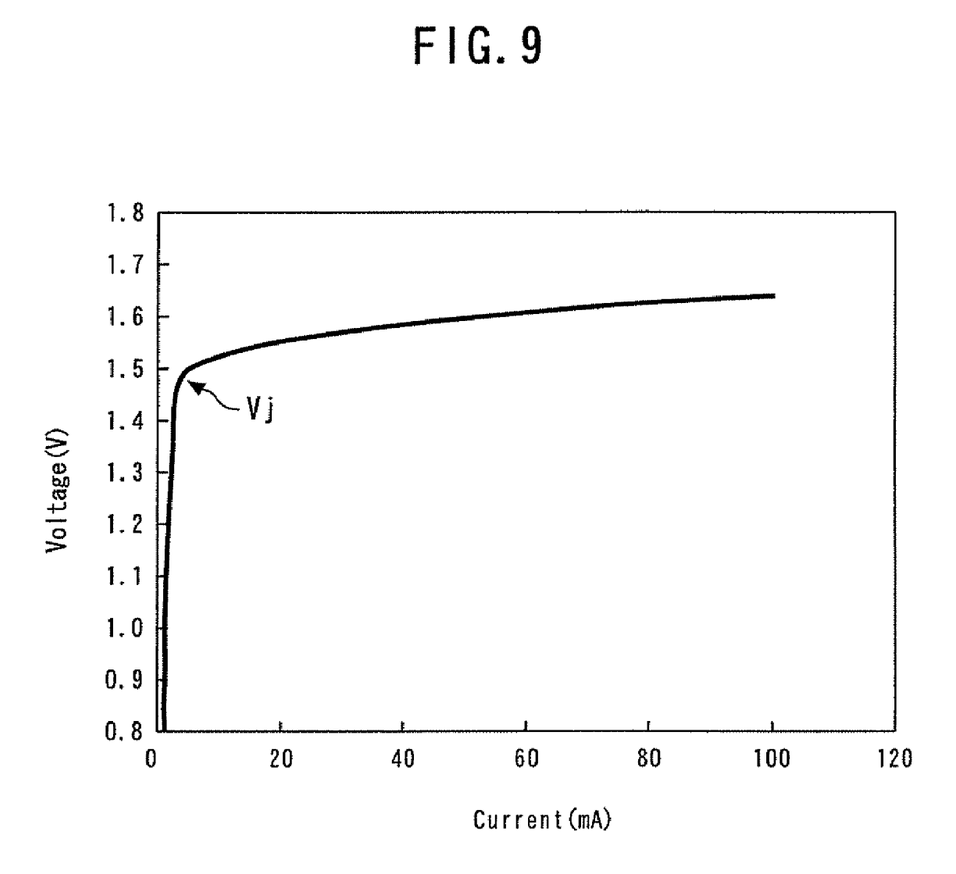
FIG. 9 shows the voltage-current characteristics of the conventional semiconductor laser.

The difference in band gap energies between the active layer and the guide layer of the above-described conventional semiconductor laser is 0.529 eV. The difference in band gap energies between the active layer and the clad layer is 0.652 eV. In this case, the former is 0.81 times the latter. In such a semiconductor laser, as FIG. 9 shows, the rising voltage of voltage-current characteristics (junction voltage) Vj elevates, and the operation voltage elevates. Therefore, when the operation current is predetermined, electrical power injected into the semiconductor laser increases. Then, the ratio of optical output for electrical input (electricity conversion efficiency) is reduced. At this time, since the portion that cannot be taken out as light is converted to heat, the properties and reliability of the semiconductor laser is lowered.

Figure 10:
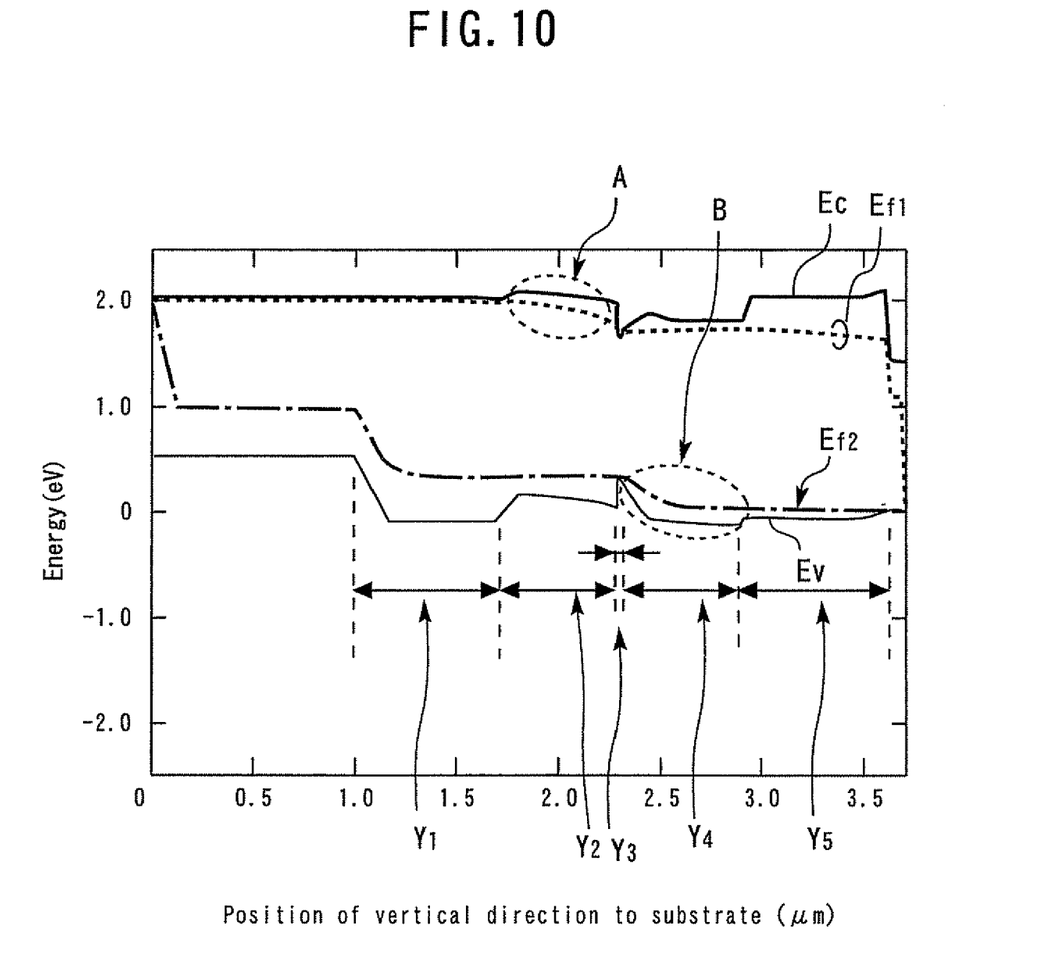
FIG. 10 shows the band diagram of the conventional semiconductor laser.

FIG. 10 shows a band diagram of the above-described conventional semiconductor laser in operation. The quasi-Fermi level $E_{f1}$ of the conduction band Ec is shown by a dotted line, and the quasi-Fermi level $E_{f2}$ of the valence band Ev is shown by a chain line. The locations of the n-type clad layer, the n-side guide layer, the active layer, the p-side guide layer, and the p-type clad layer are denoted by $Y_1$ to $Y_5$, respectively. When the above-described semiconductor laser is in operation, electrons are injected from the n-type clad layer $Y_1$, through the n-side guide layer $Y_2$ and the active layer $Y_3$, to the p-side guide layer $Y_4$. Here, since the n-side guide layer is not doped with an impurity, the density of the electron passing through the n-side guide layer must be equal to the density of the hole passing through the layer. Therefore, when band gap energy difference between the n-side guide layer and the active layer is large, $E_{f1}$ in this layer (portion "A") is largely slanted.

Furthermore, in the above-described operation, holes are injected from the p-type clad layer $Y_5$ through the p-side guide layer $Y_4$ and the active layer $Y_3$, to the n-side guide layer $Y_2$. In this case, by the phenomenon similar to the above-described phenomenon, $E_{f2}$ in the p-side guide layer (portion "B") is largely slanted. When the slopes of $E_{f1}$ and $E_{f2}$ are generated, the junction voltage Vj rises, and the operation voltage of the semiconductor laser increases.

When the thicknesses of the above-described n-side guide layer and p-side guide layer are less than 100 nm, since electrons and holes can be sufficiently transferred by diffusion or drifting, the reduction of junction voltage Vj can be expected. In this case, however, the light intensity distribution of laser beams is present in the n-type clad layer and p-type clad layer, and the slope efficiency of the semiconductor laser is lowered by the effect of free carrier absorption. In order to avoid this, the thicknesses of the above-described guide layer must be 100 nm or more.

SUMMARY OF THE INVENTION

The present invention has been developed to solve the above-described problems, and therefore it is an object of the present invention to provide a stacked structure in a semiconductor laser which suppress the junction voltage and operation voltage to be low in a semiconductor laser wherein the thickness of at least one of the n-side guide layer and the p-side guide layer is 100 nm or more.

The above object is achieved by a semiconductor laser comprising a first clad layer of a first conductivity type whose band gap energy is Eg(C1), a first guide layer whose band gap energy is Eg(G1), which is formed on said first clad layer, an active layer whose band gap energy is Eg(A) for generating laser beams, which is formed on said first guide layer, a second guide layer whose band gap energy is Eg(G2), which is formed on said active layer, and a second clad layer of a second conductivity type whose band gap energy is Eg(C2) formed on said second guide layer, and wherein, at least one of said first guide layer and said second guide layer has a thickness of 100 nm or more, and the larger one of the difference of Eg(G1) from Eg(A) and the difference of Eg(G2) from Eg(A) is 0.66 times or less of the smaller one of the difference of Eg(C1) from Eg(A) and the difference of Eg(C2) from Eg(A).

According to the present invention, a stacked structure of a semiconductor laser can be obtained wherein, the thickness of at least one of the n-side guide layer and the p-side guide layer is 100 nm or more, and the junction voltage and operation voltage can be suppressed to be low.

Other features and advantages of the invention will be apparent from the following description taken in connection with the accompanying drawings.

DETAILED DESCRIPTION OF THE PREFERRED EMBODIMENTS

Embodiments of the present invention will be described below referring to the drawings. In the drawings, the same or equivalent parts will be denoted by the same reference numerals, and the description thereof will be simplified or omitted.

First Embodiment

Figure 1:
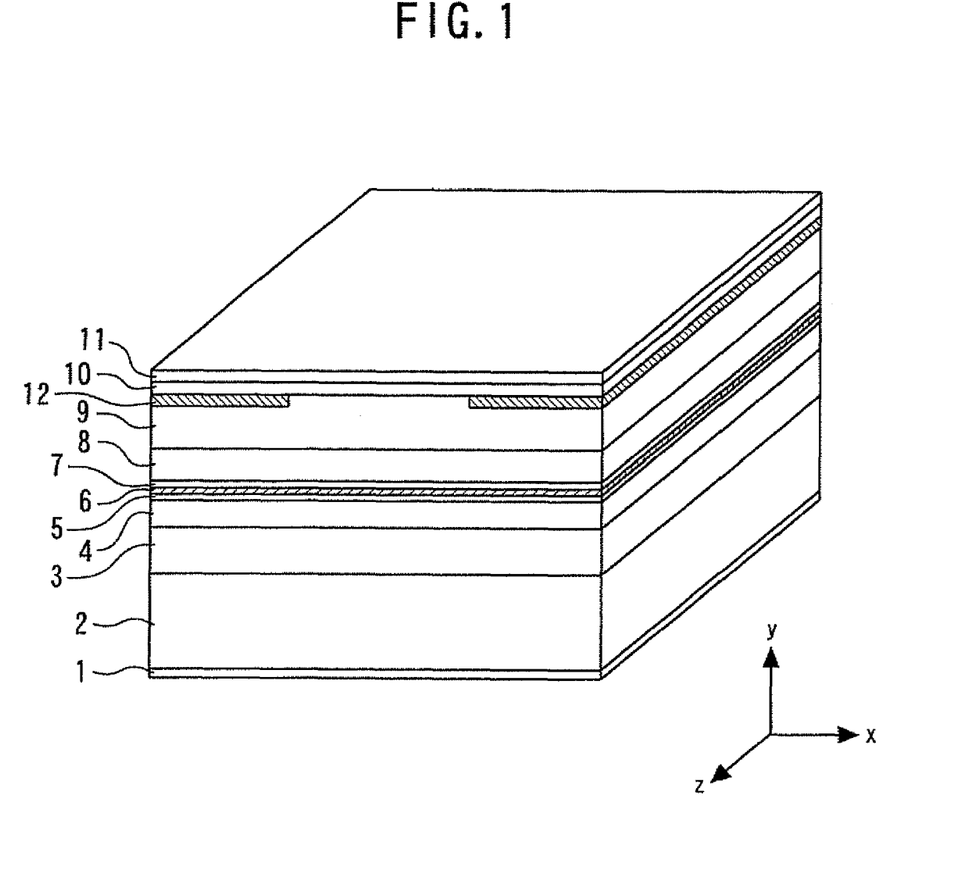
FIG. 1 shows a sectional perspective view of the semiconductor laser of the first embodiment.

A semiconductor laser according to the first embodiment will be described. FIG. 1 shows a sectional perspective view of the above-described semiconductor laser. The semiconductor laser is formed using an n-type GaAs substrate 2. On the n-type GaAs substrate 2, a first clad layer 3 composed of n-type $(Al_{0.3}Ga_{0.7})_{0.5}In_{0.5}P$, a first guide layer 4 composed of $In_{0.33}Ga_{0.67}As_{0.40}P_{0.60}$ (film thickness: 600 nm), a first enhancing layer 35 composed of $GaAs_{0.88}P_{0.12}$ (film thickness: 10 nm), an active layer 6 composed of $In_{0.07}Ga_{0.93}As$ (film thickness: 12 nm), a second enhancing layer 7 composed of $GaAs_{0.88}P_{0.12}$ (film thickness: 10 nm), a second guide layer 8 composed of $In_{0.33}Ga_{0.67}As_{0.40}P_{0.60}$ (film thickness: 600 nm), and a second clad layer 9 composed of p-type $(Al_{0.3}Ga_{0.7})_{0.5}In_{0.5}P$ are stacked. On the both sides of the upper surface of the second clad layer 9, proton implanted regions 12 are provided. On the second clad layer 9 and the proton implanted regions 12, a contact layer 10 composed of p-type GaAs, and a p-electrode 11 are stacked. On the back face of the GaAs substrate 2, an n-electrode 1 is provided.

In the operation of the semiconductor laser, holes are injected into the active layer 6 from the second clad layer 9 side, and electrons are injected into the active layer 6 from the first clad layer 3 side. By combining these holes and electrons, laser beams are generated in the active layer 6.

In the structure shown in FIG. 1, if the percentage composition of In in the active layer 6 is made of be 0.07 and the layer thickness is made to be 10 nm, the oscillation wavelength of the semiconductor laser can be close to 940 nm. The proton implanted regions 12 have a higher resistance compared with other regions. Therefore, the current can be concentrated in the regions other than the proton implanted regions 12. Although the thicknesses of the first guide layer 4 and the second guide layer 8 are 600 nm, the thicknesses are not limited thereto as long as they are 100 nm or more.

Figure 2:
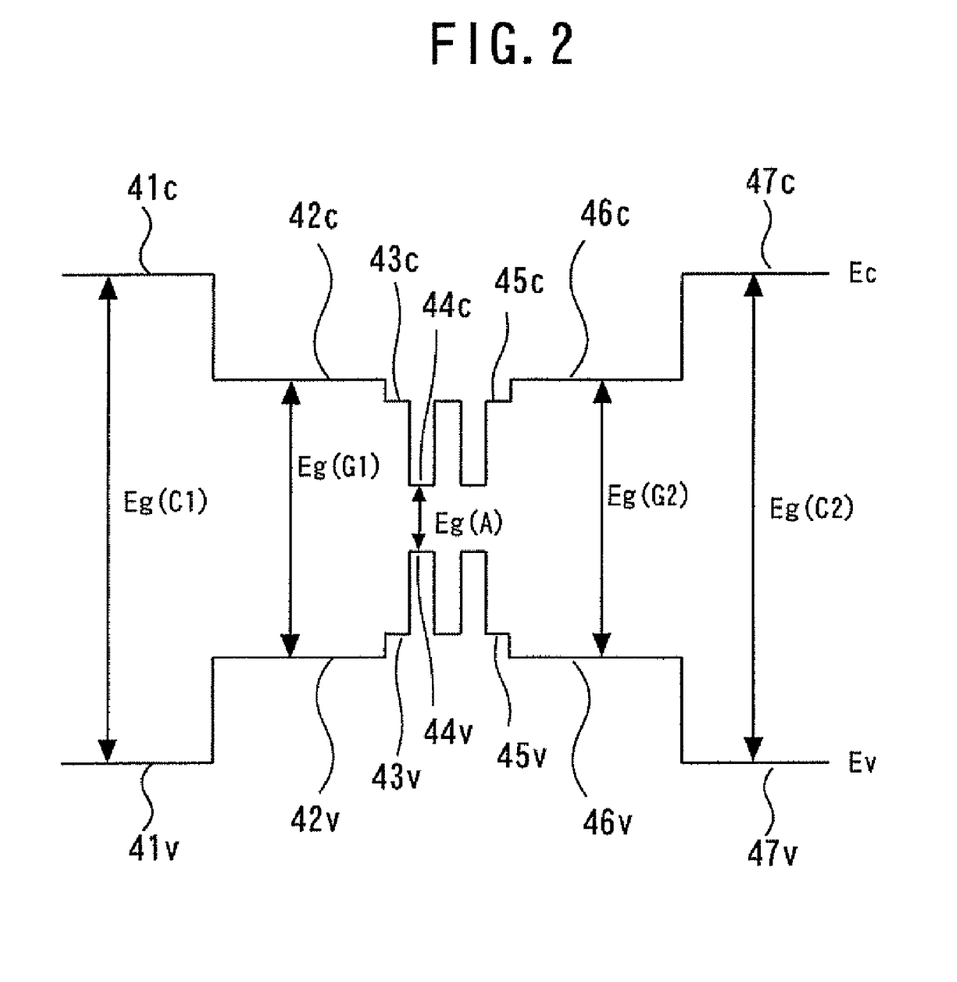
FIG. 2 shows a band diagram of the conduction band and valence band of the semiconductor laser of the first embodiment.

Next, the band gap energy (hereafter, the band gap energy is expressed by "Eg") of the semiconductor laser shown in FIG. 1 will be described. FIG. 2 shows a band diagram of the conduction band and valence band of stacked films from the first clad layer 3 to the second clad layer 9 in FIG. 1. As FIG. 2 shows, the conduction bands 41c to 47c of the first clad layer 3, the first guide layer 4, the first enhancing layer 5, the active layer 6, the second enhancing layer 7, the second guide layer 8, and the second clad layer 9 are formed. Corresponding to these conduction bands, valence bands 41v to 47v are formed.

Here, the Eg of the first clad layer 3 equals to difference between the conduction band 41c and the valence band 41v, that is Eg(C1). The Eg of the first guide layer 4 equals to difference between the conduction band 42c and the valence band 42v, that is Eg(G1). The Eg of the active layer 6 equals to difference between the conduction band 44c and the valence band 44v, that is Eg(A). The Eg of the second guide layer 8 equals to difference between the conduction band 46c and the valence band 46v, that is Eg(G2). The Eg of the second clad layer 9 equals to difference between the conduction band 47c and the valence band 47v, that is Eg(C2). Here, the relationship of Eg(C1)=Eg(C2)>Eg(G1)=Eg(G2) >Eg(A) is formed.

According to Z. C. Feng et al., the Eg of $(Al_{0.3}Ga_{0.7})_{0.5}In_{0.5}P$, that is, the Egs of the first clad layer 3 and the second clad layer 9, is 1.971 eV. Specifically, Eg(C1)=Eg(C2)=1.971 eV. According to K. Iga, the Eg of $In_{0.33}Ga_{0.67}As_{0.40}P_{0.60}$, that is, the Egs of the first guide layer 4 and the second guide layer 8 is 1.653 eV. Specifically, Eg(G1)=Eg(G2)=1.653 eV. According to K. S. Chan et al., the Eg of $In_{0.07}Ga_{0.93}As$, that is, the Eg of the active layer 6 is 1.319 eV. Specifically, Eg(A)=1.319 eV.

From these Eg values, difference between Eg(A) and Eg(G1) (or difference between Eg(A) and Eg(G2)) is 0.334 eV. Difference between Eg(A) and Eg(C1) (or difference between Eg(A) and Eg(C2)) is 0.652 eV. Specifically, |Eg(G1)−Eg(A)|=|Eg(G2)−Eg(A)|=0.334 eV, |Eg(C1)−Eg(A)|=|Eg(C2)−Eg(A)|=0.625 eV, and the former is 0.51 times the latter.

Figure 3:
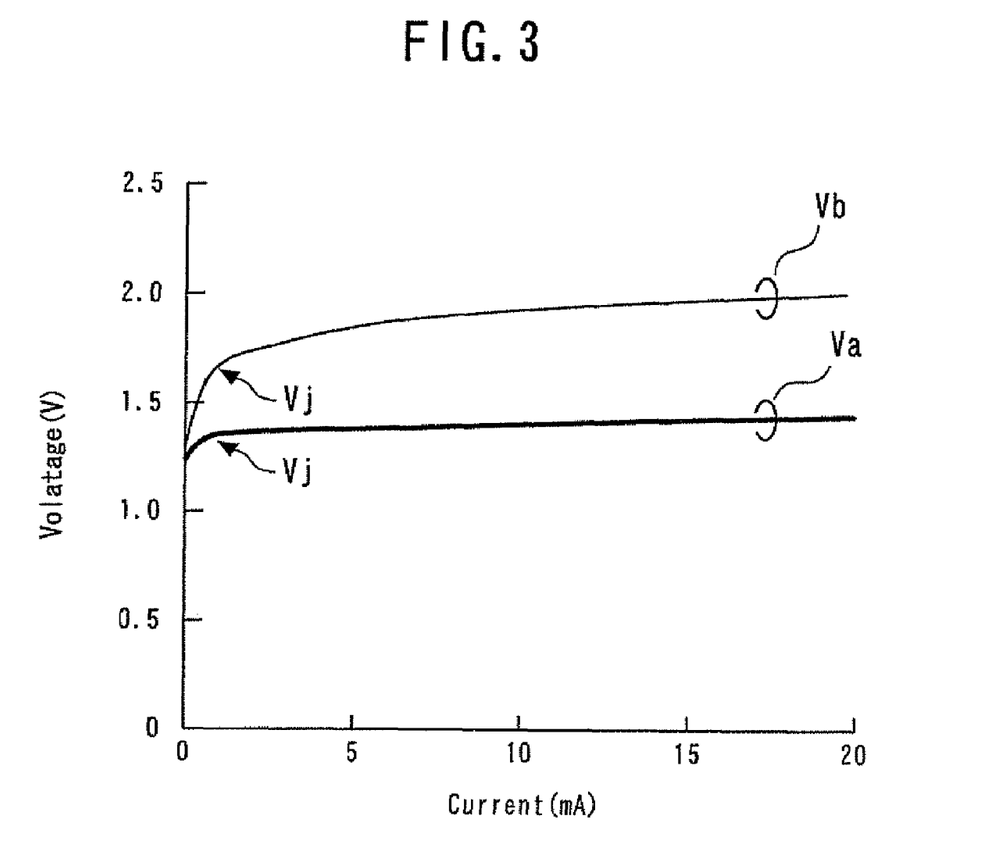
FIG. 3 shows a result of the simulation for the voltage-current characteristics of the semiconductor laser of the first embodiment.

FIG. 3 shows a result of the simulation for the voltage-current characteristics of the semiconductor laser shown in FIG. 1. In this graph, the voltage-current characteristics of the structure of FIG. 1 are shown as Va. The voltage-current characteristics when the difference between the Eg of the guide layer and the Eg of the active layer is 68% of the difference between the Eg of the clad layer and the Eg of the active layer (conventional art) are shown as Vb. As FIG. 3 shows, the junction voltage Vj or Vb is higher than 1.5 V, and the operation voltage is correspondingly elevated. Whereas, the junction voltage Vj of Va is about 1.4 V, which is lower compared with the conventional art. It is also known that the operation voltage is largely reduced.

Figure 4:
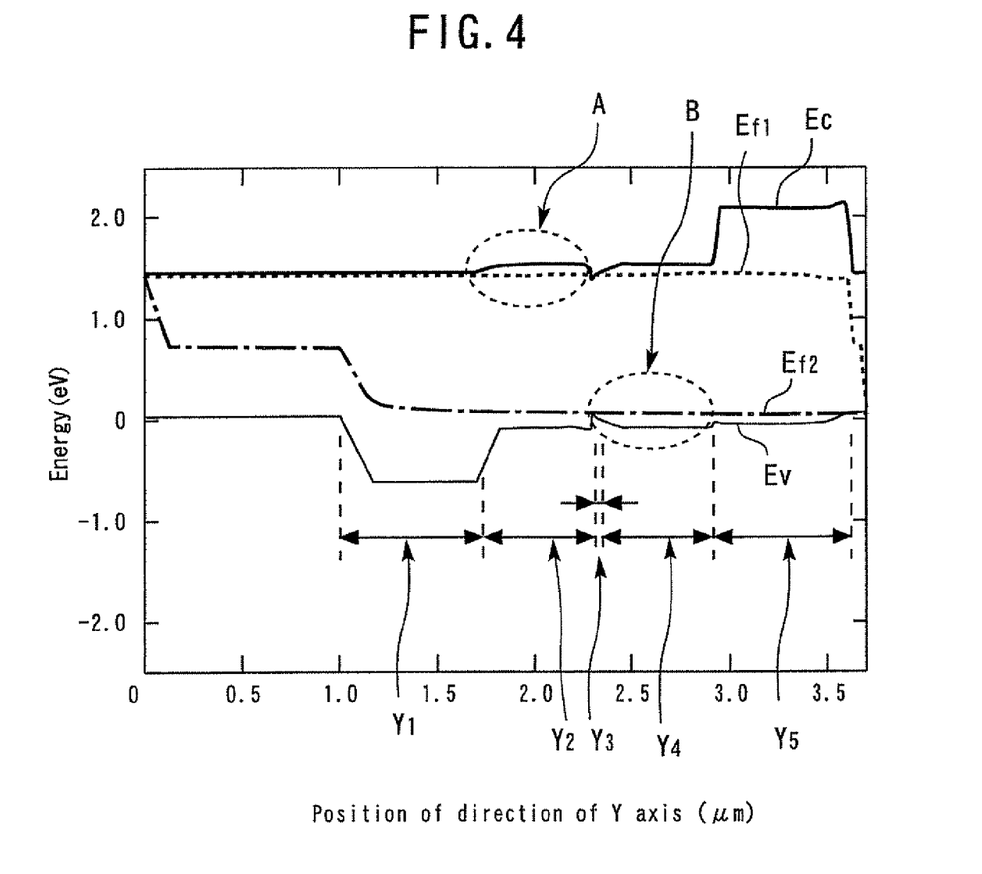
FIG. 4 shows a result of the simulation of the band diagram of the semiconductor laser of the first embodiment.

Next, FIG. 4 shows a result of the simulation of the band diagram of the semiconductor laser shown in FIG. 1. The quasi-Fermi level $E_{f1}$ of the conduction band Ec is shown by a dotted line, and the quasi-Fermi level $E_{f2}$ of the valence band Ev is shown by a chain line. The locations of the first clad layer 3, the first guide layer 4, the active layer 6, the second guide layer 8, and the second clad layer 9 in FIG. 1 in the Y direction are denoted by $Y_1$ to $Y_5$, respectively. As FIG. 4 shows, little slope of $E_{f1}$ can be seen in the portion A in the location $Y_2$ in the first guide layer 4. In other words, in the first guide layer 4, the slope of the quasi-Fermi level of the conduction band can be substantially eliminated. Furthermore, in the location $Y_4$ in the second guide layer 8, little slope of $E_{f2}$ can be seen in the portion B. In other words, in the second guide layer 8, the slope of the quasi-Fermi level of the valence band can be substantially eliminated.

Specifically, by the structure shown in FIG. 1, as FIG. 4 shows, the slope of the quasi-Fermi level of the conduction band in the first guide layer 4 and the slope of the quasi-Fermi level of the valence band in the second guide layer 8 can be substantially eliminated. Thereby, as FIG. 3 shows, the junction voltage Vj and the operation voltage of the semiconductor laser can be reduced.

Figure 5:
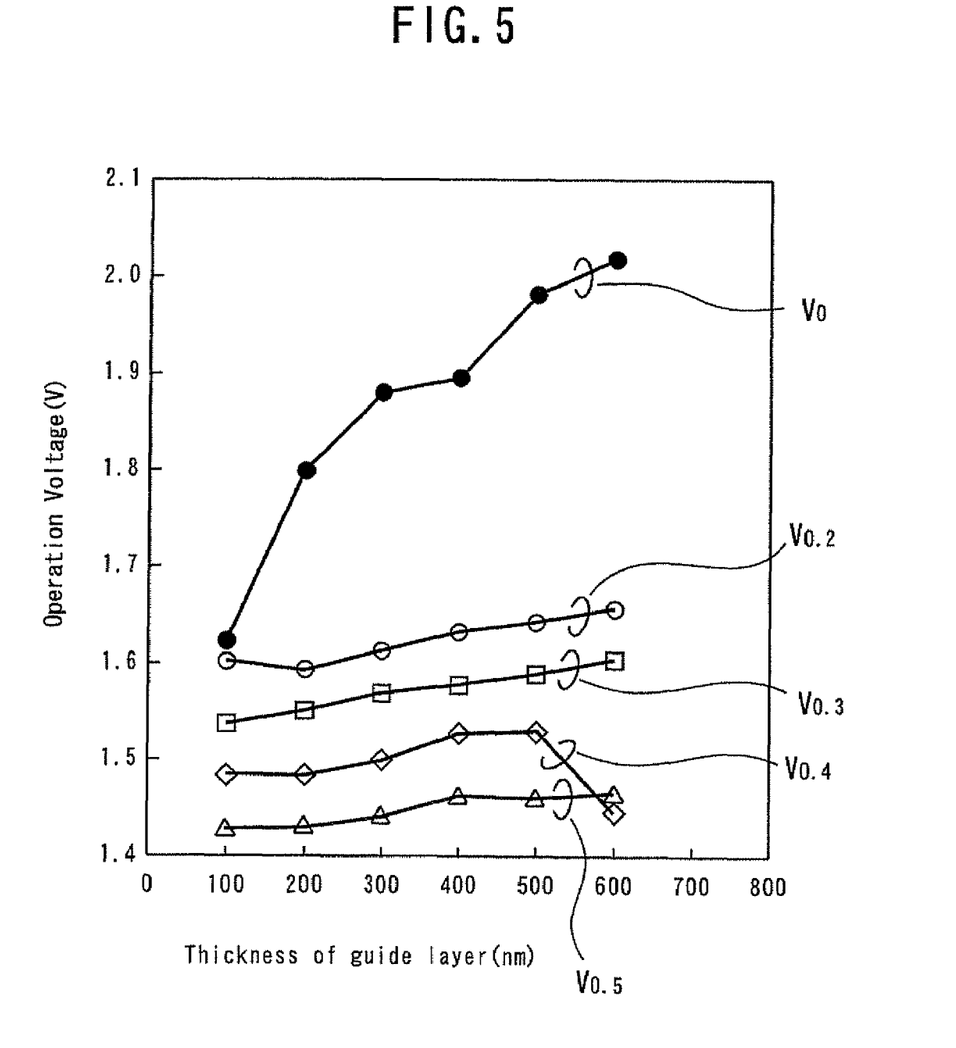
FIG. 5 shows a result of the simulation of the operation voltage of the semiconductor laser of the first embodiment.

Next, FIG. 5 shows a result of the simulation of the operation voltage of the semiconductor laser by changing the thicknesses and As percentage composition of the first guide layer 4 and the second guide layer 8 in FIG. 1. Here, the resonator length of the semiconductor laser is 1000 μm, the stripe width is 1 μm, and the injected current in operation is 20 mA. The layer thickness of each of the above-described guide layers is within a range between 100 and 600 nm. Here, when the Ga percentage composition and As percentage composition of InGaAsP in the first guide layer 4 and the second guide layer 8 are y and x, respectively, x and y in $In_{1-y}Ga_yAs_xP_{1-x}$ have a relationship of y=(1.0+x)/2.08. The operation voltages when the above-described As percentage composition (the value of x in $In_{1-y}Ga_yAs_xP_{1-x}$, wherein y=(1.0+x)/2.08) is 0.2, 0.3, 0.4 and 0.5) are denoted by $V_{0.2}$, $V_{0.3}$, $V_{0.4}$ and $V_{0.5}$, respectively. As a reference for these, the operation voltage when $In_{0.49}Ga_{0.51}P$ is used as the above-described guide layers is denoted by Vo.

As FIG. 5 shows, it is known that the operation voltage of the semiconductor laser is considerably reduced from $V_{0.2}$, $V_{0.3}$, $V_{0.4}$ and $V_{0.5}$ compared with Vo. In other words, when the layer thickness of each of the first guide layer 4 and the second guide layer 8 is 100 nm or more, the operation voltage of the semiconductor laser can be considerably reduced by making the As percentage composition x in $In_{1-y}Ga_yAs_xP_{1-x}$ (wherein y=(1.0+x)/2.08) be 0.2 or more.

Although the case when the thickness of each of the above-described guide layers is 100 to 600 nm is shown in FIG. 5, the layer thickness can be 600 nm or more. However, since the interdiffusion coefficient of electrons and holes is about several microns, any more thickening of the guide layers is not realistic. Because the current is forced to flow by drifting, and after all, the operation voltage increases.

According to K. Iga, when the above-described As percentage composition is 0.2, 0.3, 0.4 and 0.5, the Egs of the above-described guide layers become 1.750, 1.701, 1.653 and 1.604 eV, respectively. At this time, the differences from the Eg of the active layer 6 (1.319 eV) are 0.431, 0.382, 0.334, and 0.285 eV, respectively. These values are 0.66 times, 0.59 times, 0.51 times and 0.44 times the difference between Eg(C1) and Eg(A) (or the difference between Eg(C2) and Eg(A)), respectively. The Egs of the InGaAsP guide layers are reduced if the above-described As percentage composition is further raised, and thereby the above-described magnification is further reduced.

From results shown in FIGS. 3 to 5, the difference between the Eg of the first guide layer 4 and the Eg of the active layer 6 (or the difference between the Eg of the second guide layer 8 and the Eg of the active layer 6) is preferably 0.66 times or less of the difference between the Eg of the first clad layer 3 and the Eg of the active layer 6 (or the difference between the Eg of the second clad layer 9 and the Eg of the active layer 6). Specifically, the difference between Eg(G1) and Eg(A) (or the difference between Eg(G2) and Eg(A)) is preferably 0.66 times or less of the difference between Eg(C1) and Eg(A) (or the difference between Eg(C2) and Eg(A)).

Thereby, the junction voltage in operation and operation voltage of a semiconductor laser can be reduced. Consequently, lowering of the electrical conversion efficiency can be suppressed, and the deterioration of characteristics or reliability of the semiconductor laser can be prevented.

In the structure shown in FIG. 1, $(Al_{0.3}Ga_{0.7})0.5In_{0.5}P$ is used as the first clad layer 3 and the second clad layer 9, $In_{0.33}Ga_{0.67}As_{0.40}P_{0.60}$ is used as the first guide layer 4 and the second guide layer 8, and $In_{0.07}Ga_{0.93}As$ is used as the active layer 6. However, from the result shown in FIG. 5, even if a film composed of $In_{0.42}Ga_{0.58}As_{0.20}P_{0.80}$, $In_{0.37}Ga_{0.63}As_{0.30}P_{0.70}$, $In_{0.28}Ga_{0.72}As_{0.50}P_{0.50}$, or the like other than $In_{0.33}Ga_{0.67}As_{0.40}P_{0.60}$ is used as the first guide layer 4 and the second guide layer 8, the operation voltage of a semiconductor laser can also be reduced.

In the first embodiment, there is shown an example wherein $(Al_{0.3}Ga_{0.7})_{0.5}In_{0.5}P$ is used as the first clad layer 3 and the second clad layer 9, and $In_{0.33}Ga_{0.67}As_{0.40}P_{0.60}$ is used as the first guide layer 4 and the second guide layer 8. Specifically, there is shown an example wherein the first clad layer 3 has the same composition as the second clad layer 9, and the first guide layer 4 has the same composition as the second guide layer 8. However, the composition of the first clad layer 3 can be different from the composition of the second clad layer 9, and the composition of the first guide layer 4 can be different from the composition of the second guide layer 8. In these cases, the larger one of the difference between Eg(G1) and Eg(A), and the difference between Eg(G2) and Eg(A) (when the differences are the same, they have no preference) is made 0.66 times or less of the smaller one of the difference between Eg(C1) and Eg(A), and the difference between Eg(C2) and Eg(A) (when the differences are the same, they have no preference). The equivalent effect in the structure of FIG. 1 can be obtained from such a structure.

In the first embodiment, an example wherein the active layer 6 has a structure sandwiched by the first enhancing layer 5 and the second enhancing layer 7 (reference to FIG. 1) is shown. However, the structure can be a structure without the above-described enhancing layers, that is, a structure wherein the active layer 6 contacts the first guide layer 4 and the second guide layer 8.

In the first embodiment, $(Al_{0.3}Ga_{0.7})_{0.5}In_{0.5}P$ is used as the first clad layer 3 and the second clad layer 9, $In_{0.33}Ga_{0.67}As_{0.40}P_{0.60}$ is used as the first guide layer 4 and the second guide layer 8, and $In_{0.07}Ga_{0.93}As$ is used as the active layer 6. However, if the layer thickness of either one of the above-described guide layers is 100 μm or more, and Egs of the above-described clad layers, guide layers and active layer satisfy the relationship shown in this embodiment, materials other than the above-described materials can also be used in the semiconductor laser.

Second Embodiment

A semiconductor laser according to the second embodiment will be described. Here, the semiconductor laser will be described focusing aspects different from the first embodiment. In the semiconductor laser of the second embodiment, n-type $In0.49Ga_{0.51}P$ is used as a first clad layer 3, and p-type $In_{0.49}Ga_{0.51}P$ is used as a second clad layer 9 in the structure in FIG. 1. As a first guide layer 4 and a second guide layer 8, $In_{0.23}Ga_{0.77}As_{0.60}P_{0.40}$ is used. Other configurations are the same as in the first embodiment.

Here, according to K. Iga, the Eg of $In_{0.49}Ga_{0.51}P$, that is, the Egs of the first clad layer 3 and the second clad layer 9 is 1.848 eV. Specifically, Eg(C1)=Eg(C2)=1.848 eV. In addition, according to the above document, the Eg of $In_{0.23}Ga_{0.77}As_{0.60}P_{0.40}$, that is, the Egs of the first guide layer 4 and the second guide layer 8 is 1.556 eV. Specifically, Eg(G1)=Eg(G2)=1.556 eV. Furthermore, since the active layer 6 is composed of the material same as the material in the first embodiment, the Eg thereof is 1.319 eV. Specifically, Eg(A)=1.319 eV.

From these Eg values, difference between Eg(A and Eg(G1) (or difference between Eg(A) and Eg(G2)) is 0.237 eV. Difference between Eg(A) and Eg(C1) (or difference between Eg(A) and Eg(C2)) is 0.529 eV. Specifically, |Eg(G1)−Eg(A)|=|Eg(G2)−Eg(A)|=0.237 ev, |Eg(C1)−Eg(A)|=|Eg(C2)=Eg(A)|=0.529 eV, and the former is 0.45 times the latter.

Figure 6:
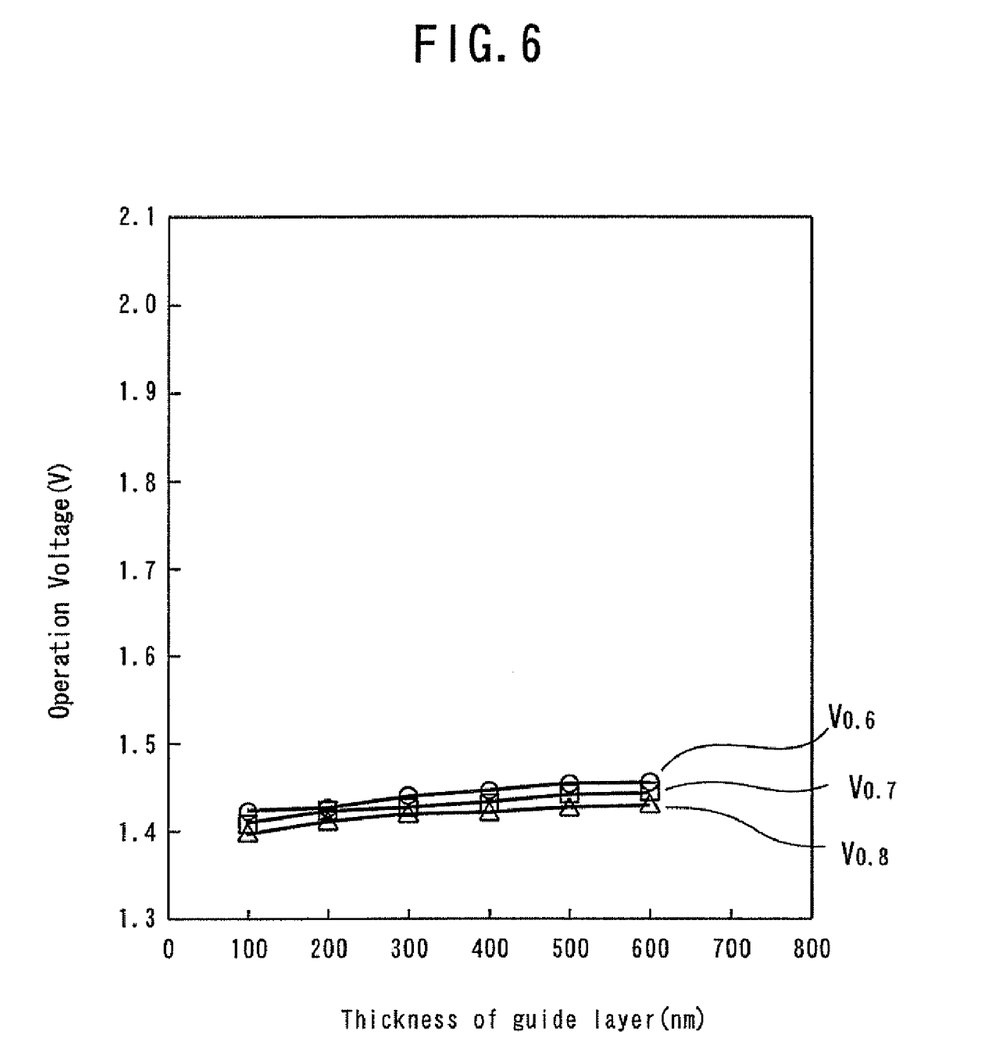
FIG. 6 shows a result of the simulation of the operation voltage of the semiconductor laser of the second embodiment.

Next, FIG. 6 shows a result of the simulation of the operation voltage of the semiconductor laser by changing the thicknesses and As percentage composition of the above-described guide layers. In the same manner as in the first embodiment, the resonator length of the semiconductor laser is 1000 μm, the stripe width is 1 μm, and the injected current in operation is 20 mA. The layer thickness of each of the above-described guide layers is within a range between 100 and 600 nm. The operation voltages when the above-described As percentage composition (the value of x in $In_{1-y}Ga_yAs_xP_{1-x}$, wherein y=(1.0+x)/2.08) is 0.6, 0.7 and 0.8 are denoted by $V_{0.6}$, $V_{0.7}$, and $V_{0.8}$, respectively.

As FIG. 6 shows, it is known that the operation voltage of the semiconductor laser is considerably reduced from $V_{0.6}$, $V_{0.7}$, and $V_{0.8}$ compared with Vo (conventional art). In other words, it is known that when the As percentage composition in InGaAsP is 0.6 or more, the operation voltage of the semiconductor laser can be considerably reduced compared with the conventional art. In other words, when $In_{0.49}Ga_{0.51}P$ is used as the first clad layer 3 and the second clad layer 9, $In_{0.23}Ga_{0.77}As_{0.60}P_{0.40}$ is used as the first guide layer 4 and the second guide layer 8, and the layer thickness of each of these guide layers is 100 nm or more, if the As percentage composition in $In_{1-y}Ga_yAs_xP_{1-x}$ is 0.6 or more, the operation voltage of the semiconductor laser can be considerably reduced.

When the As percentage composition in the above-described guide layers is 0.6, 0.7 and 0.8, according to K. Iga, the Egs of the guide layers are 1.556, 1.508, and 1,461, respectively. These values are about 0.45 times, about 0.36 times, and about 0.27 times the difference between Eg(C1) and Eg(A) (or the difference between Eg(C2) and Eg(A)) of 0.529 eV, respectively.

Specifically, according to the structure of the second embodiment, the difference between Eg(G1) and Eg(A) (or the difference between Eg(G2) and Eg(A)) is 0.66 times or less of the difference between Eg(C1) and Eg(A) (or the difference between Eg(C2) and Eg(A)). Thereby, in the same way as in the first embodiment, the junction voltage and the operation voltage of the semiconductor laser can be reduced.

Third Embodiment

A semiconductor laser according to the third embodiment will be described. Here, the semiconductor laser will be described focusing aspects different from the first embodiment. In the semiconductor laser of the third embodiment, $Al_{0.15}Ga_{0.05}As$ is used as a first guide layer 4 and a second guide layer 8 in the structure in FIG. 1. Other configurations are the same as in the first embodiment.

Here, according to K. S. Chan et al., the Eg of $Al_{0.15}Ga_{0.85}As$, that is, the Egs of the first guide layer 4 and the second guide layer 8 is 1.594 eV. Specifically, Eg(G1)=Eg(G2)=1.594 eV. The Eg of the active layer 6 is 1.319 eV. Specifically, Eg(A)=1.319 eV. The Eg of each of the first clad layer 3 and the second clad layer 9 is 1.971 eV. Specifically, Eg(C1)=Eg(C2)=1.971 eV.

From these Eg values, difference between Eg(A) and Eg(G1) (or difference between Eg(A) and Eg(G2)) is 0.275 eV. Difference between Eg(A) and Eg(C1) (or difference between Eg(A) and Eg(C2)) is 0.652 eV. Specifically, |Eg(G1)−Eg(A)|=|Eg(G2)−Eg(A)|=0.275 eV, |Eg(C1)−Eg(A)|=|Eg(C2)−Eg(A)|=0.652 eV, and the former is 0.42 times the latter.

Specifically, according to the structure of the third embodiment, the difference between Eg(G1) and Eg(A) (or the difference between Eg(G2) and Eg(A)) is 0.66 times or less of the difference between Eg(C1) and Eg(A) (or the difference between Eg(C2) and Eg(A)). Thereby, in the same way as in the first embodiment, the junction voltage and the operation voltage of the semiconductor laser can be reduced.

Fourth Embodiment

Figure 7:
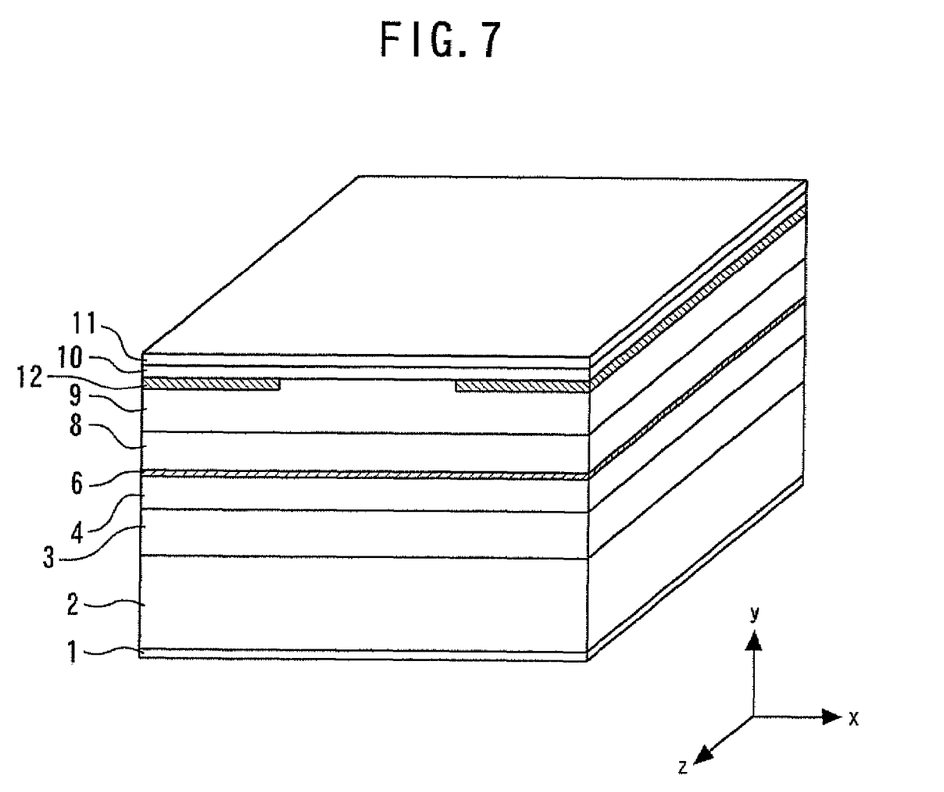
FIG. 7 shows a sectional perspective view of the semiconductor laser of the fourth embodiment.

A semiconductor laser according to the fourth embodiment will be described. Here, the semiconductor laser will be described focusing aspects different from the first embodiment. FIG. 7 shows a sectional perspective view of the semiconductor laser. On a first guide layer 4, an active layer 6 is formed, and a second guide layer 8 is formed thereon. Specifically, in the structure of the fourth embodiment, the first enhancing layer 5 and the second enhancing layer 7 shown in FIG. 1 are not provided. In addition, $In_{0.47}Ga_{0.53}As_{0.10}P_{0.90}$ is used as the material for the first guide layer 4 and the second guide layer 8. As the active layer 6, $GaAs_{0.88}P_{0.12}$ is used. By using the above-described material as the active layer 6, a semiconductor laser having a oscillation wavelength of about 808 nm can be realized. Other configurations are the same as in the first embodiment.

Here, according to K. Iga, the Eg of $In_{0.47}Ga_{0.53}As_{0.10}P_{0.90}$, that is, the Egs of the first guide layer 4 and the second guide layer 8 is 1.799 eV. Specifically, Eg(G1)=Eg(G2)=1.799 eV. In addition, according to A. G. Thompson, M. Cardona, and K. L. Shaklee, "Electroreflectance in the GaAs-GaP," Phys. Rev., Vol. 146, No. 2, pp. 601-610, June 1966, the Eg of $GaAs_{0.88}P_{0.12}$, that is, the Eg of the active layer 6 is 1.575 eV. Specifically, Eg(A) =1.575 eV. Furthermore, since the first clad layer 3 and the second clad layer 9 are composed of the material same as the material in the first embodiment, the Eg thereof is 1.971 eV. Specifically, Eg(C1)=Eg(C2)−1.971 eV.

From these Eg values, difference between Eg(A) and Eg(G1) (or difference between Eg(A) and Eg(G2)) is 0.224 eV. Difference between Eg(A) and Eg(C1) (or difference between Eg(A) and Eg(C2)) is 0.396 eV. Specifically, |Eg(G1)−Eg(A)|=|Eg(G2)−Eg(A) |=0.224 eV, |Eg(C1)−Eg(A)|=|Eg(C2)−Eg(A)|=0.396 eV, and the former is 0.57 times the latter.

Figure 8:
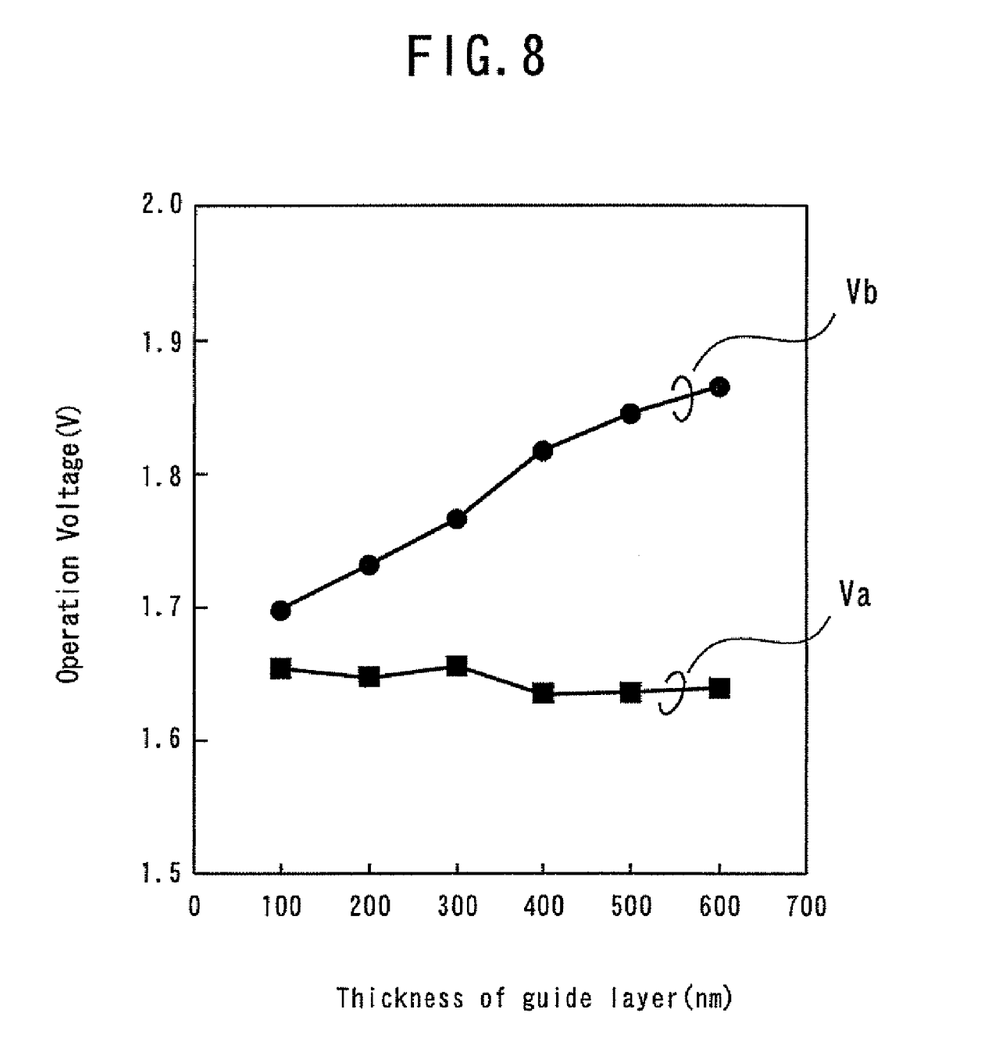
FIG. 8 shows a result of the simulation of the operation voltage of the semiconductor laser of the fourth embodiment.

Next, FIG. 8 shows a result of the simulation of the operation voltage of the semiconductor laser by changing the thicknesses of the above-described guide layers. In the same manner as in the first embodiment, the resonator length of the semiconductor laser is 1000 μm, the stripe width is 1 μm, and the injected current in operation is 20 mA. The operation voltage when $In_{0.47}Ga_{0.53}As_{0.10}P_{0.90}$ is used as the above-described guide layers is denoted by Va, and the operation voltage when $In_{0.49}Ga_{0.51}P$ is used as the above-described guide layers (reference) is denoted by Vb. As FIG. 8 shows, compared with the case where $In_{0.49}Ga_{0.51}P$ is used as the above-described guide layers (Vb), the operation voltage of the semiconductor laser is reduced when $In_{0.47}Ga_{0.53}As_{0.10}P_{0.90}$ is used (Va).

Specifically, according to the structure of the fourth embodiment, the difference between Eg(G1) and Eg(A) (or the difference between Eg(G2) and Eg(A)) is 0.66 times or less of the difference between Eg(C1) and Eg(A) (or the difference between Eg(C2) and Eg(A)). Thereby, as FIG. 8 shows, the operation voltage of the semiconductor laser can be reduced.

In the first to fourth embodiments described above, a structure of a semiconductor laser using a GaAs substrate is shown. However, the equivalent effects can be obtained from a nitride-based compound semiconductor laser using a substrate of semiconductor materials other than the GaAs substrate, such as GaN, InGaN, AlGaN.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-14625, filed in Jan. 24, 2006 including specification, claims, drawings and summary, on which the Convention priority of the present application is based, are incorporated herein by reference in its entirety.

The invention claimed is:

1. A semiconductor laser comprising:
   a first cladding layer of a first conductivity type and having a band gap energy Eg(C1);
   a first guide layer having a band gap energy Eg(G1), on said first cladding layer;
   an active layer having a band gap energy Eg(A), for generating a laser beam, and on said first guide layer;
   a second guide layer having a band gap energy Eg(G2), on said active layer; and
   a second cladding layer of a second conductivity type, having a band gap energy Eg(C2), and on said second guide layer, wherein
   at least one of said first guide layer and said second guide layer has a thickness of at least 100 nm, and
   the larger one of the difference of Eg(G1) from Eg(A) and the difference of Eg(G2) from Eg(A) is no more than 0.66 times the smaller of the difference of Eg(C1) from Eg(A) and the difference of Eg(C2) from Eg(A).

2. The semiconductor laser according to claim 1, wherein
   said first cladding layer and said second cladding layer are AlGaInP;
   said first guide layer and said second guide layer are InGaAsP; and
   said active layer is InGaAs.

3. The semiconductor laser according to claim 2, wherein the percentage composition of As contained in the InGaAsP of said first guide layer and of said second guide layer is at least 0.2.

4. The semiconductor laser according to claim 1, wherein
   said first cladding layer and said second cladding layer are InGaP;
   said first guide layer and said second guide layer are InGaAsP; and
   said active layer is InGaAs.

5. The semiconductor laser according to claim 4, wherein the percentage composition of As contained in the InGaAsP of said first guide layer and of said second guide layer is at least 0.6.

6. The semiconductor laser according to claim 1, wherein
   said first cladding layer and said second cladding layer are AlGaInP;
   said first guide layer and said second guide layer are AlGaAs; and
   said active layer is InGaAs.

7. The semiconductor laser according to claim 1, wherein
   said first cladding layer and said second cladding layer are AlGaInP;
   said first guide layer and said second guide layer are InGaAsP; and
   said active layer is GaAsP.

* * * * *